United States Patent [19]

Dinh

[11] Patent Number: 4,602,422
[45] Date of Patent: Jul. 29, 1986

[54] FLASH COMPRESSION PROCESS FOR MAKING PHOTOVOLTAIC CELLS

[76] Inventor: Khanh Dinh, 1618 SW. 76 Terrance, Gainesville, Fla. 32607

[21] Appl. No.: 742,433

[22] Filed: Jun. 7, 1985

Related U.S. Application Data

[63] Continuation-in-part of Ser. No. 621,474, Jun. 18, 1984, abandoned.

[51] Int. Cl.$^4$ .................... H01L 31/18; H01L 21/302
[52] U.S. Cl. .......................................... 29/581; 29/572; 29/582; 29/584; 29/585; 136/258; 148/183; 148/184; 148/191; 264/27; 264/61; 264/104; 264/332; 427/74; 427/86; 357/2; 357/30; 357/59
[58] Field of Search .................. 29/572, 581, 582, 584, 29/585; 148/183, 184, 188, 191, DIG. 22, DIG. 7; 156/602; 136/258 AM, 258 PC; 264/25–27, 61, 104, 332; 427/74, 86

[56] References Cited

U.S. PATENT DOCUMENTS

| | | | |
|---|---|---|---|
| 2,597,923 | 5/1952 | Croston | 156/379.6 |
| 3,170,996 | 2/1965 | Kemeny et al. | 264/22 |
| 3,250,832 | 5/1966 | Metz | 264/27 |
| 3,312,540 | 4/1967 | Plumbo et al. | 65/59 |
| 3,328,841 | 7/1967 | Bryman | 425/1 |
| 3,520,732 | 7/1970 | Nakayama et al. | 136/258 |
| 3,585,088 | 6/1971 | Schwuttke et al. | 148/174 |
| 3,632,242 | 1/1972 | Rasquin et al. | 425/77 |
| 4,141,764 | 2/1979 | Authier et al. | 148/174 |
| 4,252,513 | 2/1981 | Kalnins | 425/126 R |
| 4,323,419 | 4/1982 | Wakefield | 156/622 |

FOREIGN PATENT DOCUMENTS 0048366  4/1981  European Pat. Off. ............ 136/258

OTHER PUBLICATIONS

A. Sanjurjo, Silicon Sheet for Solar Cells, *J. Electrochem. Soc.:* vol. 128, Oct. 1981, pp. 2244–2247.

*Primary Examiner*—Aaron Weisstoch
*Attorney, Agent, or Firm*—Karen M. Gerken; Martin P. Hoffman; Mitchell B. Wasson

[57] ABSTRACT

A flash compression process for the manufacture of photovoltaic cells wherein a powder of photovoltaic material is compressed under high pressure between upper and lower compression members and is simultaneously melted in place by means of an electric discharge supplied through the compression members. The photovoltaic material is subjected to a controlled solidification process by which impurities are confined to one side of the photovoltaic cell. The photovoltaic cell may be formed directly on a substrate and may be surface doped during the formation process.

20 Claims, 3 Drawing Figures 4,602,422

FLASH COMPRESSION PROCESS FOR MAKING PHOTOVOLTAIC CELLS

Related Applications

This application is a continuation-in-part of U.S. patent application Ser. No. 621,474 filed on June 18, 1984, now abandoned.

BACKGROUND OF THE INVENTION

1. Field of the Invention

The invention relates to a process for manufacture of photovoltaic cells. Such cells are used for direct conversion of light into electricity and find application in areas as diverse as communications, irrigation, cathodic protection, and the like. Practical application of the photovoltaic technology has ben limited, however, by the high cost of manufacture for the photovoltaic cell. Additionally, conventional processes of manufacture for photovoltaic cells have failed to yield cells having high efficiencies. Thus, novel cost and efficiency breakthroughs are necessary to insure the future feasibility of photovoltaics as a reliable and effective source of energy.

The basic photovoltaic cell is made from a wafer of semiconductive material, typically silicon. Although the pure crystal has no free electrons in the crystal lattice and is thus a poor conductor of electricity, the conductive qualities of the material may be altered by adding minute amounts of other elements. This procedure, called doping, creates the N-type silicon and P-type silicon that forms the basis for a photovoltaic cell. N-type slicon, which is characterized by free electrons, results when a small amount of an element such as phosphorus is added to the silicon. P-type silicon, on the other hand, is characterized by voids or holes in the crystal and results when silicon is diffused with a small amount of an element such as boron. A manufacturing process wherein the dopants may be applied to the semiconductive material during actual formation of the photovoltaic cell would significantly enhance cell technology.

Layers of the N- and P-type silicon combine to form the basic photovoltaic cell. The interface of the N- and P-type silicon is the semiconductor junction and is the location of photovoltaic activity. Photons of light penetrate through the N-type silicon to the semiconductor junction, forming hole-electron pairs that create electricity.

Several factors influence the practicality and efficiency of the photovoltaic cell. In order to supply power to an external circuit in practical applications, it is necessary to provide metallic connections from the N- and P-type silicons. For P-type silicon, which is often the body of the cell, this may be accomplished by including a metallic plate, or substrate, at the bottom of the cell. For the N-type silicon, which is generally a very thin layer diffused on top of the P-type body, a metallic grid is deposited or formed by a photolythic process to perform the electric connection. Thus, the need exists in photovoltaic technology for a process of manufacture which allows the active semicoductive wafer to be formed directly upon a substrate.

The feasibility of photovoltaic applications also depends upon the ability to manufacture cells of high efficiency. Desirable efficiencies are obtained when the photovoltaic cell is very thin, so that light can rapidly penetrate through the cell to the P-N junction where the photovoltaic effect is created. The cell must also be very thin in order to realize the cost reduction that accompanies a savings in raw material. It is essential that the manufacturing process allow for the production of cells of only several hundred microns of thickness. Cell efficiency can be further enhanced by improving the quality of the photovoltaic cell. The quality of the cell depends directly upon the success with which impurities in the semiconductive material are controlled. It is therefore essential that a manufacturing process provide for controlled impurity migration and segregation.

2. Discussion of the Prior Art

Several prior art patents are directed to processes for manufacturing solar cells or substrates wherein electrical heating and compression are utilized. U.S. Pat. No. 4,390,743 discloses a method for producing a low resistance silicon substrate by powder metallurgy to which is applied an active silicon layer. The substrate is formed when a compacted silicon member is fused or sintered at high temperature, preferably by a short term electrical current for a short time, while under simultaneous mechanical pressure. The pressure is applied by means of compression members, which do not conduct electricity, located at the top and bottom of the silicon member. Electrical current is supplied by means of electrodes located at each side of the silicon member. The substrate thus formed is itself unsuitable for solar use as it requires the additional application of an active silicon layer by means of another process, such as chemical deposition, vapor deposition, or centrifugal rotation. While the process acknowledges the possibility of compressing and electrically heating the compacted silicon powder member together with an overlying active layer, the voltage requirements would be prohibitively high. This is so because the current must pass through the entire width of the silicon member, which could be several inches, and must thus overcome the high resistance of the silicon. Furthermore, impurities present in the silicon member will be attracted to the electrodes and will thus migrate toward the outer edges of the member. Impurity segregation toward the outer boundaries of the solar cell make it unsuitable for solar use. High energy requirements, the possibility of undesirable arcing at high voltages, and the absence of impurity control render the process impractical for production of a complete solar cell.

European Patent Application No. 0048366 discloses a process for producing silicon film solar cells by powder metallurgy that utilizes a substrate consisting of a silicon powder molding fused at a high temperature by a brief electric current with the simultaneous application of pressure. A silicon film may be formed on the subsate by compression molding and brief heating of the silicon in powdered form. In an article entitled "Silicon Sheet for Solar Cells", appearing at pages 2244–2246 of the Oct. 1981 issue of the *Journal of Electrochemical Society*, the author of the article, A. Sanjurjo, discusses a method for casting silicon sheet wherein liquid silicon coated with a fused salt is pressed in a rod-piston system. Pressure is applied to a graphite crucible containing the silicon-salt mixture while heating is provided by induction in the crucible.

The prior art also discloses the application of a temperature gradient to a silicon layer in an effort to achieve impurity segregation. U.S. Pat. No. 4,141,764 discloses a process for the manufacture of large surface area silicon bonded to a substrate. Silicon is deposited by means of gas deposition onto a electrically heated substrate and is converted from its molten state into crystalline form under the influence of a temperature gradient. The free surface of the silicon is cooled for several minutes by passage of a cooling gas and by simultaneously reducing the supply of electric current to the substrate. One of the major drawbacks of this process lies in the difficulty, if not impossibility, of maintaining the cooling gas at the same temperature over the entire surface of the silicon, particularly for very large sheets. Moreover, the cooling stage of this process requires several minutes, resulting in loss of control over the solidification process which, for silicon, is by nature far more rapid. The solidification front of the silicon will progress from its outer boundaries to its center, failing to achieve the desired impurity migration from top to bottom.

The prior art addresses the concept of doping a solar cell during the cell formation process. U.S. Pat. No. 4,323,419 discloses a method for ribbon solar cell production wherein dopant is disposed above the solar cell ribbon in a region where the molten semiconductor material is crystallizing such that it penetrates the surface and is contained therein. The process also discloses a method of differential cooling of the semiconductor material in a tangential direction.

Finally, several prior art patents are directed to the general fabrication of semiconductor devices. U.S. Pat. No. 3,520,732 discloses a process for the preparation of photovoltaic cells wherein the cells are produced by hot pressing a P-type semiconductor plate and an N-type semiconductor plate into a single laminated body. A method for producing a semiconductor device consisting of an oriented crystal overgrowth supported on a substrate is disclosed in U.S. Pat. No. 3,585,088. A film of crystalline material is deposited on a substrate and irradiated with a laser beam pulse sufficient to reorient the crystal lattice of the film.

None of the prior art processes discloses an accurate and feasible method for making a complete solar-quality photovoltaic cell directly upon a substrate by means of electric heating and compression at relatively low voltages and high pressures wherein impurities in the semiconductive material are subject to controlled migration and wherein dopant may be applied to the cell during its formation.

SUMMARY OF THE INVENTION

The present invention is directed to a novel process for making a solar-quality photovoltaic cell by means of flash compression. A superior quality photovoltaic cell is formed according to the process of the present invention by depositing a powder of purified photovoltaic material between the upper and lower anvils of a conventional press. The press includes a hydraulic cylinder by means of which the anvils may be actuated to apply a high pressure compressive force to the powder therebetween. The anvils are connected to a source of electric power by transmission lines and, upon activation of a switching device, operate as electrodes for the transmission of an electric discharge from the power source to the photovoltaic material. The anvils are electrically isolated from each other to the extent that each anvil offers very high impedance to current flowing in the other.

According to the instant process, the anvils are actuated to apply a high pressure compressive force to the photovoltaic powder deposited between them. The switching device is activated to simultaneously transmit an electrical discharge from the power source to the anvils, thereby causing the photovoltaic powder to melt in place. The intensity of the electrical discharge required varies according to the thickness of the photovoltaic cell to be formed. Similarly, the magnitude of the compressive force applied by the anvils varies according to the structure of photovoltaic material desired.

Melting of the photovoltaic material is accomplished in approximately one second, after which time the voltage is reduced incrementally at equal intervals of time until it is finally switched off. After approximately one voltage drop, the photovoltaic material begins to solidify. The pressure on the photovoltaic material is maintained during this phase so as to obtain a photovoltaic wafer of only several hundred microns in thickness. The upper and lower anvils are designed so as to cool at different rates with each voltage reduction. By utilizing a different cooling rate between the anvils, the solidification front of the photovoltaic material progresses from the face of the wafer adjacent the more rapidly cooled anvil to the face of the wafer adjacent the more slowly cooled anvil. Impurities are thus confined to the last liquid portion of the photovoltaic material adjacent the more slowly cooled anvil. The resulting product is a photovoltaic wafer having high purity on one side and a high concentration of impurities on the other side.

The photovoltaic wafer may be formed directly upon a suitable substrate and may be surface doped during its formation.

It is an object of the invention to provide a novel, cost-effective method for producing photovoltaic cells.

It is a further object of this invention to produce a photovoltaic cell of high efficiency.

An additional object of the invention is to produce a photovoltaic wafer that is very thin.

It is an object of the invention to produce a photovoltaic cell that requires less photovoltaic material.

Another object of the invention is to produce a photovoltaic wafer wherein impurities are confined to a small portion of the wafer.

It is also an object of the invention to produce a photovoltaic cell that is surface doped during formation of the semiconductive wafer.

It is an additional object of the invention to produce a photovoltaic cell that is formed directly on a substrate.

It is an object of the invention to produce a photovoltaic cell having a metallic substrate that acts as an electrode as well as a support for the cell.

The foregoing objects and other features of the invention are apparent from the description of the preferred embodiment as illustrated by the accompanying drawings.

DETAILED DESCRIPTION OF THE PREFERRED EMBODIMENTS

Figure 1:
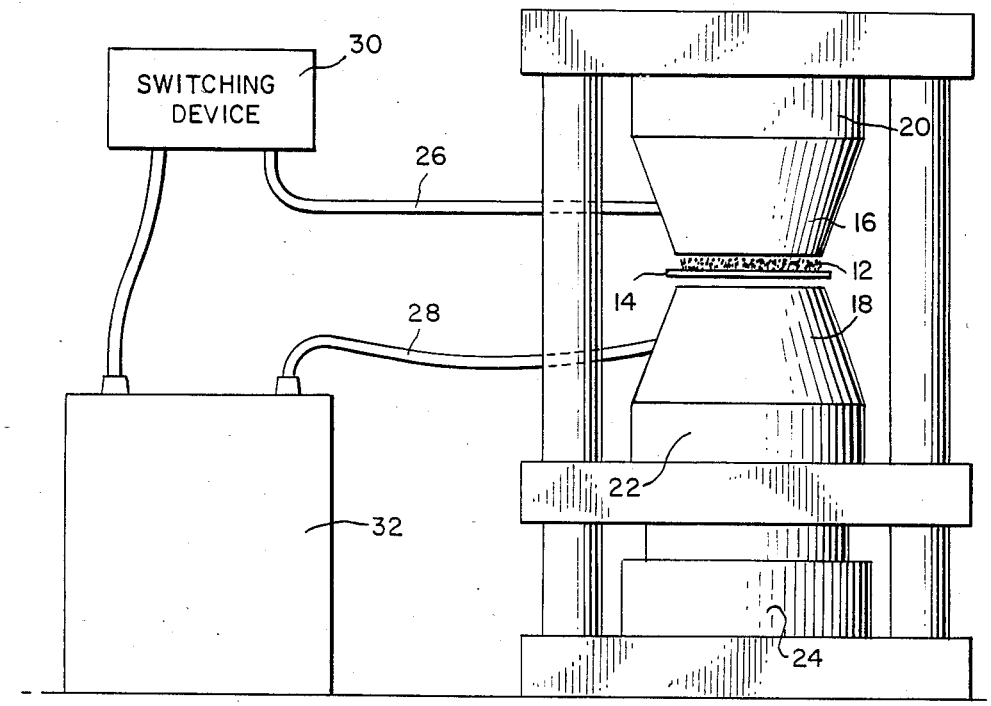
FIG. 1 is a schematic view illustrating the apparatus for implementing the instant flash compression process for producing photovoltaic cells.

Refering to FIG. 1 of the drawing, a powder of purified photovoltaic material 12, typically P-type silicon, is deposited between upper and lower anvils 16, 18 of a conventional press. The press includes a hydraulic cylinder 24 by means of which the anvils may be actuated to apply a high pressure compressive force to the powder therebetween. The anvils are electrically isolated by means of insulators 20, 22 so that each anvil offers a high impedence to current flowing in the other. Each anvil is connected to a power source, such as a capacitor bank 32, through electrical transmission lines 26, 28. The capacitor bank is charged by means of a voltage source (not shown).

According to the process of the present invention, the anvils are actuated by hydraulic cylinder 24 to apply a high pressure compressive force to the photovoltaic powder deposited between them. The magnitude of the pressure applied by the anvils determines the particular structure of the photovoltaic wafer formed through the instant process. Amorphous structures of photovoltaic material are obtained at pressures below ½ ton per square inch while larger polycrystalline structures are obtained with pressures of one ton per square inch and more. The switching device 30 is activated to simultaneously transmit an electrical discharge from the capacitor bank 32 to the anvils via the transmission lines 26, 28, thereby causing the photovoltaic powder to melt in place. The intensity of the electrical discharge required to melt the photovoltaic powder varies according to the thickness of the photovoltaic cell to be formed. Hence, higher voltages are required to overcome the increased resistance presented by greater amounts of photovoltaic powder in thicker cells. With photovoltaic cells of 200 to 500 microns in thickness, the voltage requirements are in the range of 100 to 200 volts with the higher voltages being required for formation of the thicker photovoltaic cells. Thus, a voltage of 200 volts is suitable for a 500 micron cell and a voltage of 100 volts is suitable for a cell of 200 microns in thickness. Actual testing has shown that the voltage supplied through the anvils should result in the liquified photovoltaic material reaching 1500 degrees Centigrade.

Melting of the photovoltaic material under the influence of the electrical discharge occurs very rapidly, in approximately one second, after which time the voltage supplied to the anvils is reduced incrementally at five second intervals until is is finally switched off. For example, for a typical voltage requirement of 200 volts for a 500 microns thick photovoltaic cell, the voltage supplied to the anvils would be reduced at five second intervals from 200 volts to 160 volts, to 120 volts, to 80 volts, to 0 volts. For a voltage requirement of 100 volts for a 200 microns thick photovoltaic cell, the voltage supplied to the anvils would be reduced at five second intervals from 100 volts, to 80 volts, to 60 volts, to 40 volts, to 20 volts, to 0 volts. After one voltage drop, or approximately five seconds, the liquified photovoltaic material begins to solidify and continues to do so with subsequent voltage reductions. The entire cooling phase thus consumes a mere 20 to 25 seconds with the actual solidification phase requiring only 15 to 20 seconds. During this cooling phase, the pressure on the photovoltaic wafer is maintained so as to realize a wafer which is desirably thin.

Figure 2:
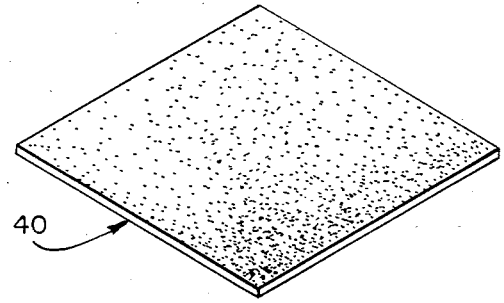
FIG. 2 is a perspective view of a photovoltaic cell produced by the apparatus of FIG. 1.

The upper and lower anvils are designed such that they cool at different rates. For example, the upper anvil may be made larger than the lower anvil so that it will cool more rapidly than the lower anvil with each voltage drop. The cooler anvil would serve essentially as a heat sink, receiving heat from the photovoltaic wafer. By thus utilizing a different cooling rate between the anvils, the solidification front of the photovoltaic material progresses from the face of the wafer adjacent the more rapidly cooled anvil to the face of the wafer adjacent the more slowly cooled anvil. The impurities in the photovoltaic material will be electrically attracted to the more slowly cooled anvil and will migrate thereto. This differential cooling procedure produces a desirable purification effect wherein impurities are confined to the last liquid portion of the photovoltaic material adjacent the more slowly cooled anvil. Migration of impurities is enhanced by the fact that crystallization under the instant process is columnar, in that the grain powder of photovoltaic material goes up and down. FIG. 2 shows a photovoltaic cell 40 produced in accordance with the process of the present invention.

Because the direction of current and heat flow is perpendicular to the wafer face, migration of the entire population of impurities is achieved in only 10 to 20 seconds. This factor represents a clear advance over prior art processes in which impurity migration is generally tangential and thus requires several minutes.

It is to be noted that other suitable means may be employed to achieve differential cooling rates between the anvils without departure from the spirit and scope of the invention.

Figure 3:
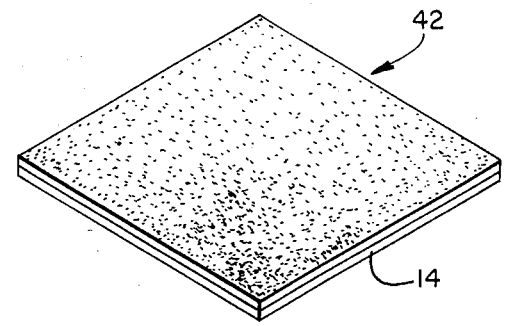
FIG. 3 is a perspective view of a photovoltaic cell produced with a substrate.

An additional modification of the invention contemplates forming the photovoltaic wafer directly on a substrate 14. The powdered photovoltaic material is deposited on a suitable metallic substrate such as stainless steel or titanium, and both are placed between the anvils and subjected to the flash compression process. The metallic substrate serves as an electrode for connection to an external circuit as well as a support for the photovoltaic cell. FIG. 3 shows a photovoltaic cell 42 formed directly on a substrate 14 by the above-described flash compression process.

A further modification of the invention involves surface doping of the photovoltaic wafer as it is formed. The doping is accomplished by coating at least one of the anvils with the proper doping substance, which may be any commercially available dopant made from boron or phosphorus, prior to flash compression of the photovoltaic powder. The doping substance is imparted to the photovoltaic material during the flash compression process and solidifies as a surface coating on the photovoltaic layer. Depending upon the doping substance selected, P- or N-type silicon wafers can be formed.

It is apparent that the resistance of this system is significantly less than that of prior art systems. Due to the location of the anvils above and below the photovoltaic material layer, the electrical discharge need only pass through the 200 to 500 microns of thickness of the photovoltaic material. Resistance heating to melt the photovoltaic material can therefore be accomplished by utilizing relatively low voltages. The ability to keep voltages low eliminates the problem of arcing found in high resistance systems and reduces energy requirements.

The application of high pressure by virtue of the anvils above and below the photovoltaic material layer insures uniformity of thickness of the photovoltaic wafer. Accurate maintenance of the thickness of the photovoltaic wafer guarantees continuity of the voltage requirement across the wafer. The perfect, intimate contact between the anvils and the photovoltaic wafer further insures uniformity of temperature across the cell and provides for excellent control over the solidification process.

Numerous other changes, modifications, and revisions in the apparatus, and in the flash compression process utilizing such apparatus, will occur to the skilled artisan. Thus, the appended claims should not be strictly construed to their expressed terms, but should be broadly construed in a manner consistent with the spirit, breadth and scope of the inventor's contribution to the useful arts and sciences.

What is claimed is:

1. A process for the manufacture of a photovoltaic cell comprising the steps of:
    (a) compressing a powder of photovoltaic material under high pressure between upper and lower compression members,
    (b) simultaneously heating said photovoltaic material to a melting temperature of approximately 1500 degrees Centigrade by means of an electric discharge supplied to said compression members,
    (c) cooling said photovoltaic material by incrementally reducing said electric discharge to said compression members, said upper and lower compression members being adapted to cool at different rates, and
    (d) maintaining said pressure during said cooling of said photovoltaic material to obtain a photovoltaic cell having a thickness of from 200 to 500 microns.

2. The process of claim 1 wherein said electric discharge supplied to said compression members to melt said photovoltaic material is of a voltage of from 100 to 200 volts.

3. The process of claim 1 wherein said electric discharge is incrementally reduced by 20 to 40 volts at five second intervals until said electric discharge is zero.

4. The process of claim 1 wherein said compression members are adapted to cool at different rates by making one of said compression members larger than the other of said compression members.

5. The process of claim 1 wherein amorphous photovoltaic cells are produced when said pressure is approximately ½ ton per square inch or less and polycrystalline photovoltaic cells are produced when said pressure is approximately one ton per square inch or more.

6. The process of claim 1 further comprising the step of depositing said powder of photovoltaic material on a substrate prior to said compressing and melting steps.

7. The process of claim 1 further comprising the step of coating at least one of said compression members with a doping substance prior to said compressing and melting steps.

8. A process for the manufacture of a photovoltaic cell comprising the steps of:
    (a) coating at least one of a pair of upper and lower compression members with a doping substance,
    (b) depositing a powder of photovoltaic material on a substrate,
    (c) compressing said photovoltaic material and said substrate under high pressure between said upper and lower compression members,
    (d) simultaneously heating said photovoltaic material to a melting temperature of approximately 1500 degrees Centigrade by means of an electric discharge supplied to said compression members,
    (e) cooling said photovoltaic material by incrementally reducing said electric discharge to said compression members such that the heat from said photovoltaic material is transferred to said compression members, said heat and said electric discharge flowing in a direction perpendicular to the face of said photovoltaic material, said upper and lower compression members being adapted to cool at different rates, and
    (f) maintaining said pressure during said cooling of said photovoltaic material to obtain a photovoltaic cell having a thickness of from 200 to 500 microns.

9. The process of claim 8 wherein said electric discharge supplied to said compression members to melt said photovoltaic material is of a voltage of from 100 to 200 volts.

10. The process of claim 8 wherein said electric discharge is incrementally reduced by 20 to 40 volts at five second intervals until said electric discharge is zero.

11. The process of claim 8 wherein said compression members are adapted to cool at different rates by making one of said compression members larger than the other of said compression members.

12. The process of claim 8 wherein amorphous photovoltaic cells are produced when said pressure is approximately ½ ton per square inch or less and polycrystalline photovoltaic cells are produced when said pressure is approximately one ton per square inch or more.

13. The process of claim 8 wherein said doping substance contains phosphorus or boron.

14. The process of claim 8 wherein said substrate is stainless steel or titanium.

15. A process for the manufacture of a photovoltaic cell comprising the steps of:
    (a) compressing a powder of photovoltaic material under high pressure between upper and lower compression members,
    (b) simultaneously heating said photovoltaic material to a melting temperature of approximately 1500 degrees Centrigrade by means of an electric discharge supplied to said compression members, said electric discharge having a voltage of from 100 to 200 volts,
    (c) incrementally reducing said electric discharge to said compression members by 20 to 40 volts at five second intervals until said electric discharge is zero so that the heat from said photovoltaic material is transferred to said compression members to thereby cool said photovoltaic material, said heat and said electric discharge flowing in a direction perpendicular to the face of said photovoltaic material, said upper and lower compression members being adapted to cool at different rates by making one of said compression members larger than the other of said compression members such that the solidification front of said photovoltaic material progresses from the face of said photovoltaic material adjacent the more rapidly cooled compression member to the face of said photovoltaic material adjacent the more slowly cooled compression member, and
    (d) maintaining said pressure during said cooling step for said photovoltaic material to obtain a photovoltaic cell having a thickness from 200 to 500 microns.

16. The process of claim 15 wherein amorphous photovoltaic cells are produced when said pressure is approximately ½ ton per square inch or less and polycrystalline photovoltaic cells are produced when said pressure is approximately one ton per square inch or more.

17. The process of claim 15 further comprising the step of depositing said powder of photovoltaic material on a substrate prior to said compressing and melting steps.

18. The process of claim 15 further comprising the step of coating at least one of said compression members with a doping substance prior to said compressing and melting steps.

19. The process of claim 15 wherein said photovoltaic material is silicon.

20. The process of claim 15 wherein impurities in said photovoltaic material are attracted to said compression member that is more slowly cooled and migrate thereto.

* * * * *